(12) United States Patent
Martin et al.

(10) Patent No.: US 6,962,762 B2
(45) Date of Patent: Nov. 8, 2005

(54) EXPOSURE POSITIONING IN PHOTOLITHOGRAPHY

(75) Inventors: Brian Martin, Plymouth (GB); Ian Daniels, Tavistock (GB)

(73) Assignee: Zarlink Semiconductor Limited (GB)

( * ) Notice: Subject to any disclaimer, the term of this patent is extended or adjusted under 35 U.S.C. 154(b) by 155 days.

(21) Appl. No.: 10/318,470

(22) Filed: Dec. 13, 2002

(65) Prior Publication Data

US 2003/0124439 A1 Jul. 3, 2003

(30) Foreign Application Priority Data

Dec. 13, 2001 (GB) .............................. 0129775

(51) Int. Cl.$^7$ ................................. G03F 9/00
(52) U.S. Cl. ................... 430/5; 430/22; 430/30
(58) Field of Search ................ 430/5, 22, 30; 257/797

(56) References Cited

U.S. PATENT DOCUMENTS

| | | | |
|---|---|---|---|
| 5,298,761 A | | 3/1994 | Aoki et al. |
| 5,922,495 A | * | 7/1999 | Kim ............................. 430/5 |
| 6,003,223 A | * | 12/1999 | Hagen et al. ............ 29/603.12 |
| 6,030,752 A | * | 2/2000 | Fulford et al. .............. 430/312 |
| 6,146,796 A | | 11/2000 | Kim |
| 6,194,105 B1 | | 2/2001 | Shacham et al. |
| 6,333,138 B1 | * | 12/2001 | Higashikawa et al. ...... 430/296 |
| 6,399,261 B1 | * | 6/2002 | Sandstrom .................... 430/30 |
| 6,428,940 B1 | * | 8/2002 | Sandstrom .................... 430/22 |
| 6,677,088 B2 | * | 1/2004 | Magome et al. ................ 430/5 |
| 6,699,639 B2 | * | 3/2004 | Suzuki ....................... 430/296 |

FOREIGN PATENT DOCUMENTS

| | | |
|---|---|---|
| EP | 1083462 | 3/2001 |
| JP | 2000-340482 | 12/2000 |

OTHER PUBLICATIONS

"High Resolution Verniers for Measuring Field Stitch and Pattern Overlay," IBM Technical Disclosure Bulletin, IB Corp. New York, U.S., vol. 33, No. 3A, pp. 80–81 (Aug. 1, 1990).

Holbrook, D.S. et al., "Microlithography for Large Area Flat Panel Display Substrates," Solid State Technology, Cowan Publ. Corp., Washington, U.S., vol. 35, No. 5, pp. 166–172 (May 1, 2001).

* cited by examiner

*Primary Examiner*—Christopher G. Young
(74) *Attorney, Agent, or Firm*—Thompson Hine LLP

(57) ABSTRACT

A reticle for use in a photolithography process for exposing a photoresist layer in the production of a component which is formed from a plurality of adjacent exposed areas. The reticle includes an exposure aperture adapted to allow light to pass through the reticle, a patterned area within the exposure aperture which defines at least part of the functional design of the component, and one or more "stitching" structures located close to one or more of the edges of the exposure aperture. The "stitching" structures are arranged to create "stitching" marks on the photoresist, which can be used to determine whether the adjacent exposed areas have been accurately positioned.

15 Claims, 2 Drawing Sheets

Figure 1. Example Layout of a mask to be used in Stitching Applications.
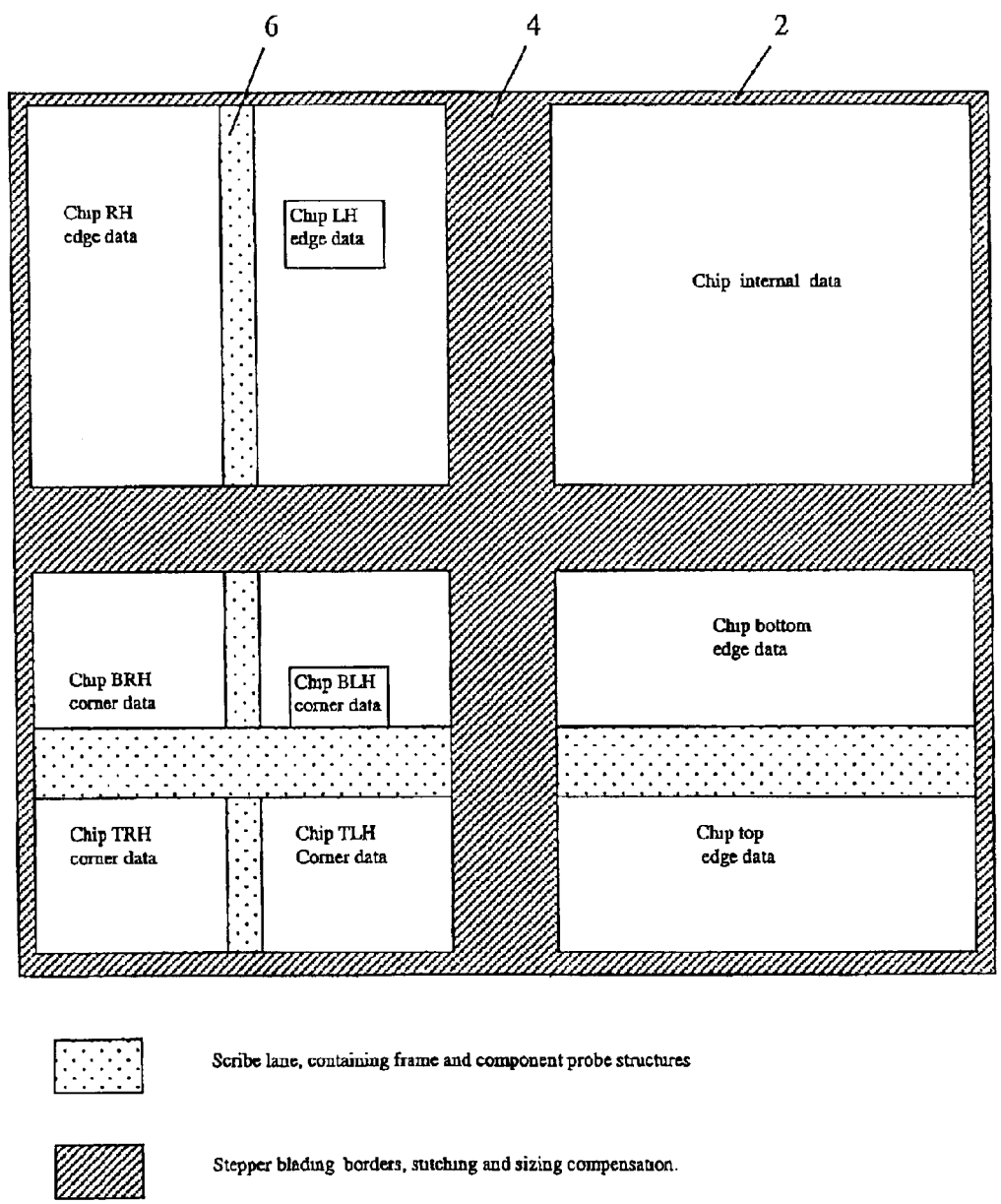

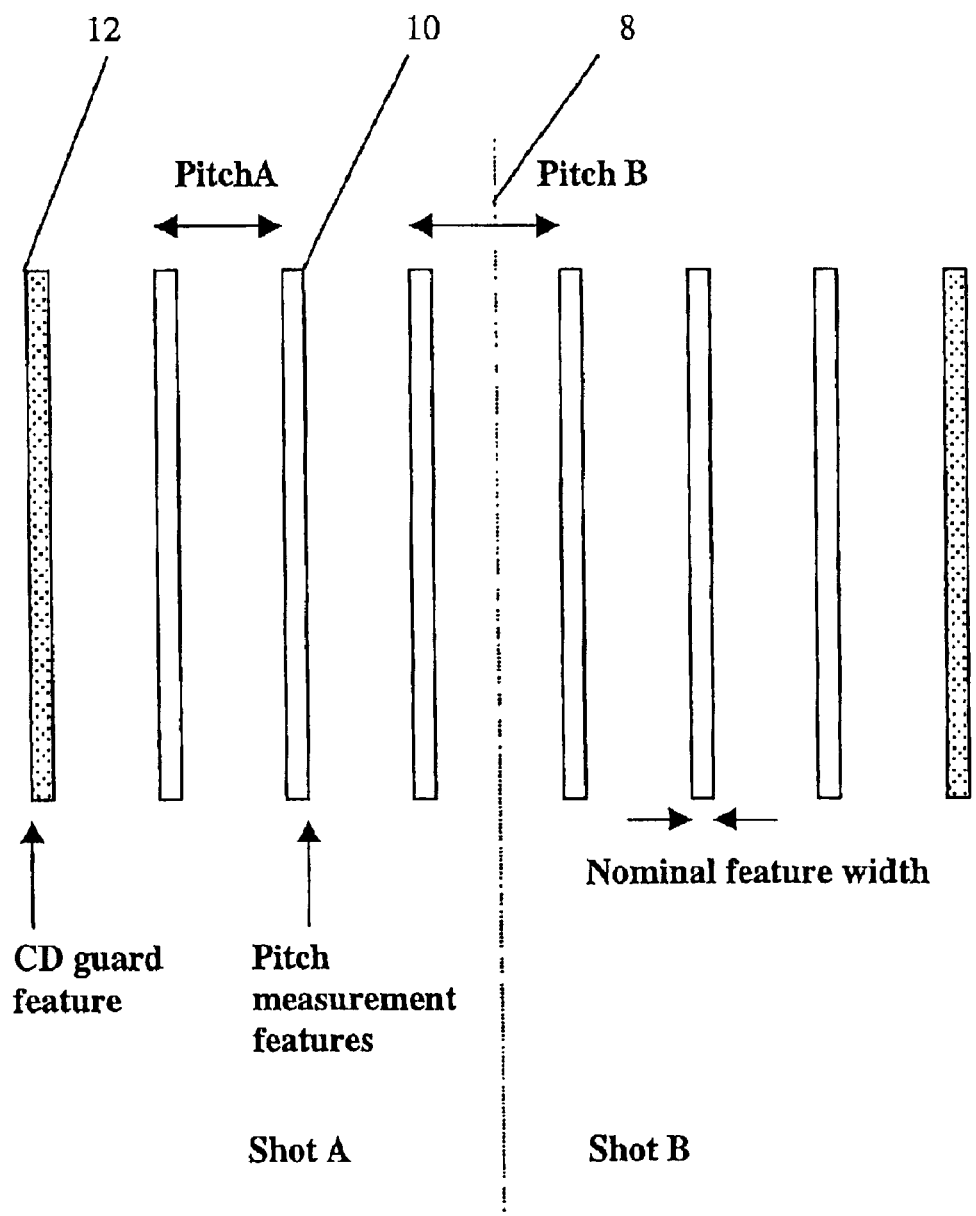
Figure 2. Schematic of Structure for In-Line Stitching Monitor.

EXPOSURE POSITIONING IN PHOTOLITHOGRAPHY

BACKGROUND

In photolithography techniques features are usually printed by passing light through a "reticle", which acts as a mask and is typically formed from glass printed with chrome patterns. In order to print lines the reticle is provided with slits which allow the light to pass through onto the photoresist (a photosensitive layer used to coat silicon in photolithography techniques). The exposed areas of the resist are removed by applying a developer, and the wafer is then etched by applying a suitable chemical.

In the lithographic stages of an IC (Integrated Circuit) or MEMS (Micro Electrical Mechanical Systems) process, light is transmitted through a mask (sometimes called a reticle) to form patterns on a wafer by means of photoresist and its developer. A common method of defining patterns on a wafer is by means of a step-and-repeat system which involves use of a reduction lens and a mechanical stage. The mechanical stage supports the wafer, and is arranged to move it accurately over given distances. Maximum field sizes on the wafer of reduction lenses (usually 5× reduction) are of the order of 20 mm square so that by means of accurately moving the wafer stage a series of many identical fields can be defined. The size of each circuit component exposed by the reticle at any given time may be much smaller than the field size, which is simply the maximum size that can be exposed at any one time. Contemporary stage technology requires that the registration of patterns to those on an underlying layer can be achieved by global alignment only whereby the whole of the wafer is aligned at 2 or 3 points to marks on the mask. Thereafter, because stage accuracy is very good, of the order of 100 nm over a distance of 22 mm, the series of fields is defined, after the global alignment, by "blind" stepping the stage, that is by moving the stage without further alignment.

Sometimes circuits require an area greater than the maximum field size available in a step-and-repeat system for correct operation. This situation provides increased demands for lithography but can be achieved by means of placing multiple elements on the mask, some of which are used more than once, and then "stitching" together the elements formed by each of the exposures. There is of course no literal "stitching", but the word "stitching" is used to refer to the accurate positioning, or butting, of one exposure next to another.

The invention seeks to address the problem of ensuring accurate "stitching" between different adjacent exposed areas.

SUMMARY

According to the invention there is provided a reticle, method and component as set out in the accompanying claims.

BRIEF DESCRIPTION OF THE DRAWINGS

An embodiment of the invention will now be described, by way of example only, with reference to the accompanying drawings, in which:

FIG. 1 shows an example layout of a mask (or reticle) to be used in a "stitching" application; and FIG. 2 is a schematic drawing of structures used to monitor the accuracy of "stitching" of adjacent components.

DETAILED DESCRIPTION

FIG. 1 shows a reticle 2 which has a chromed (opaque) area 4 which divides the mask into four separate exposure regions. Each exposure region is provided with a chrome pattern (not shown) which defines the circuit layout when the photoresist is exposed.

The top right exposure area is labelled "chip internal data", and is used for exposing the inner area of the chip. The top left exposure area is divided by a scribe lane 6 into "chip right hand edge data" and chip left hand edge data". The scribes lanes 6 do not carry circuit chrome patterns, but do contain test and measurement structures. The bottom right exposure area is divided by a scribe lane 6 into "chip bottom edge data" and "chip top edge data". Finally, the bottom left exposure area is divided by scribe lanes 6 into four corner areas, as labelled in FIG. 1.

The different exposure areas of the mask 2 shown in FIG. 1 can be used more than once in order to create a large component on a chip. For example, the "chip internal data" exposure area may be used, say, nine times to create a square, with each exposed area on the photoresist exactly abutting the next exposed area. The left and right edge data areas, and top and bottom edge data areas, would then each be used three times to expose the areas to the left, right, top and bottom of the square area. The four corner areas would then be used to fill in the corners, so that the resulting exposed area forms a large square.

It should be appreciated that electrical connections may extend across the boundaries between different exposed areas. Because of the continuity of the resulting circuit across the boundaries of the individual exposures, the term "stitching" is used to describe the process of placing the exposed areas adjacent each other.

The technique of "stitching" together different exposed areas relies for success on the aforementioned "blind" step stage accuracy. FIG. 1 shows a layout of a mask 2 to be used for making a circuit whose area is greater than the maximum stepper field. The mask shows four circuit elements of equal size including the scribe lanes 6. The element marked "chip internal data" can be repeated several times to make a rectangular or square array and then surrounded by the appropriate remaining elements to form one large circuit which can be as large as the whole wafer area. The successful placement of elements is achieved by "stitching" them together and this method relies on the "blind" step capability of the wafer stage.

If there are any errors in exposing the photoresist, it is possible to clean off the photoresist and recoat with a further layer of photoresist at any stage before chemical etching of the wafer has taken place.

Lithographic processes are often monitored in-line both for linewidth measurements and layer-to-layer registration by scanning electronic microscopy (SEM) and optical means respectively. The use of the "stitching" technique requires an extra in-line monitor as failure to operate within the mechanical specifications of the stage could lead to circuit failure.

An arrangement for in-line "stitching" monitoring is shown in FIG. 2. The vertical dotted line 8 is the intended, or nominal, "stitching" border. Either side of the borders 8 are two elements of the "stitching" layout (called shots A and B).

In the present embodiment we place periodic identical linear "stitching" structures 10 on either side of the blading border, either in scribe lanes 6 and/or in the chip area such that the right hand line of shot A and the left hand line of shot B are at known and equal distances, B/2, from the nominal "stitching" border 8 making the intended distance between them equal to Pitch B. The remaining lines are at Pitch A. A=B is allowable and recommended but not essential.

By way of explanation, when the reticle 2 is exposed, a number of "blades" (not shown) are used to prevent light passing through any area of the reticle except the desired area, in a similar way to the shutter of a camera aperture. This gives rise to the term "blading border" which represents the edge of the area of the reticle to be exposed.

Returning to FIG. 2, when shots A and B are defined on the wafer, Pitch B can be readily measured automatically on an SEM or by optical inspection and compared with the reference value. When A=B any deviation between the measured pitch B and the measured reference pitch A is attributed to stage stepping error without recourse to the relationship between A and B. It is important for Pitch A and Pitch B to be much greater than the maximum expected stage error, as defined by the machine specification. For example, for stage accuracy of the order of 100 nm, pitches A and B should be of the order of 1 micron. Therefore, if A=B=1 micron, the measurement of Pitch B less 1 micron is the stage or "stitching" error.

If scribe lanes 6 are present, as in the case of three of the exposure areas shown in FIG. 1, then the lines 10 can be placed within the scribe lanes 6, close to the blading border. For example, for the bottom right exposure area, the blading border might run along the centre of the scribe lane 6 between the "chip bottom edge data" area and the "chip top edge data" area.

If scribe lanes are not present, as in the case of the "chip internal data" area shown in FIG. 1, then the "stitching" lines 10 should be placed at the edge of the exposure area as space permits. This will depend on how much space has been left by the chip designer.

The outermost lines 12 from the nominal stitching border 8 are called guard features and should not be used in stage accuracy measurements because optical proximity effects can result in the outer line (being semi-isolated) of an array being defined at a different linewidth.

Identical structures can be placed orthogonally in order to detect both x and y stage stepping errors. In one embodiment, orthogonal "stitching" lines are placed at each corner of the "chip internal data" exposure area, and at each corner of each of the other exposure areas shown in FIG. 1. It will be appreciated that the "stitching" lines do not need to extend along the whole length of the edges of the exposure areas.

The width of the lines in the arrays is not important as all measurements are taken on pitch distances but a linewidth between 25% and 50% of the chosen pitch will be convenient.

The invention is applicable to any IC or MEMS process in which stitching of adjacent areas takes place.

What is claimed is:

1. A reticle for use in a photolithography process for exposing a photoresist layer in the production of a component which is formed from a plurality of adjacent exposed areas, the reticle comprising:
   an exposure aperture adapted to allow light to pass through the reticle;
   a patterned area within said exposure aperture which defines at least part of the functional design of the component; and
   one or more "stitching" structures located close to one or more of the edges of the exposure aperture, said "stitching" structures being arranged to create "stitching" marks on the photoresist, which can be used to determine whether said adjacent exposed areas have been accurately positioned.

2. A reticle as claimed in claim 1, wherein said "stitching" structures are located in scribe lanes, which do not contain any patterned area relating to the function of the component.

3. A reticle as claimed in claim 1, wherein said "stitching" structures comprise straight lines.

4. A reticle as claimed in claim 3, wherein each "stitching" structure comprises a plurality of parallel straight lines.

5. A reticle as claimed in claim 4, wherein at least some of said parallel straight lines are equally spaced.

6. A reticle as claimed in claim 5, wherein the spacing of said equally spaced lines is substantially equal to the desired spacing between adjacent lines in adjacent exposed areas.

7. A reticle as claimed in claim 1, wherein said "stitching" structures are located at the corners of said exposure aperture.

8. A reticle as claimed in claim 1, wherein said "stitching" structures comprise orthogonal lines.

9. A reticle as claimed in claim 1, which comprises a plurality of exposure apertures.

10. A reticle as claimed in claim 1, wherein said at least one "stitching" structure does not relate to the function of the component.

11. A reticle as claimed in claim 1, wherein the "stitching" structures are such that, using scanning electronic microscopy (SEM), it is possible to determine, using said "stitching" marks on the photoresist, whether said adjacent exposed areas having been accurately positioned.

12. A method of exposing a plurality of adjacent areas of a photoresist, the method comprising:
   providing a reticle for exposing the photoresist layer in the production of a component, the reticle comprising:
      an exposure aperture adapted to allow light to pass through the reticle;
      a patterned area within said exposure aperture which defines at least part of the functional design of the component; and
      one or more "stitching" structures located close to one or more of the edges of the exposure aperture, said "stitching" structures being arranged to create "stitching" marks on the photoresist, which can be used to determine whether said adjacent exposed areas have been accurately positioned; and
   measuring the distances between adjacent "stitching" marks in adjacent exposed areas of the photoresist, in order to determine whether said adjacent exposed areas have been accurately positioned.

13. A method as claimed in claim 12, wherein a wafer coated with said photoresist layer is moved by a mechanical stage between exposure of said exposed areas.

14. A method as claimed in claim 12, wherein measuring said distances comprises measuring said distances using scanning electronic microscopy (SEM).

15. A method as claimed in claim 12, wherein the patterned areas of adjacent exposed areas butt together at a stitching line.

* * * * *